United States Patent [19]

Lhotsky et al.

[11] Patent Number: 4,473,771
[45] Date of Patent: Sep. 25, 1984

[54] THERMIONIC EMITTER FOR ELECTRON MICROSCOPY

[75] Inventors: Stephen Lhotsky, Québec; Yves Poussart, Québec, both of Canada

[73] Assignee: Universite Laval, Ste-Foy, Canada

[21] Appl. No.: 274,724

[22] Filed: Jun. 18, 1981

[30] Foreign Application Priority Data

Jun. 20, 1980 [CA] Canada ................................. 354645

[51] Int. Cl.³ .......................... H01J 1/16; H01J 19/10
[52] U.S. Cl. ................................ 313/336; 204/129.43; 204/129.55; 204/129.7; 219/69 W; 313/337
[58] Field of Search ........................ 313/336, 337, 346; 204/206, 129.43, 129.55, 129.7, 12; 219/69 W

[56] References Cited

U.S. PATENT DOCUMENTS

| | | | |
|---|---|---|---|
| 2,934,631 | 4/1960 | Imalis et al. | 204/129.43 |
| 3,358,174 | 12/1967 | Glenn, Jr. | 313/336 |
| 3,363,961 | 1/1968 | Coleman et al. | 313/336 X |
| 3,374,386 | 3/1968 | Charbonnier et al. | 313/346 |
| 3,461,338 | 8/1969 | Vogel | 313/336 X |
| 3,631,291 | 12/1971 | Faureau | 313/336 |
| 3,814,975 | 6/1974 | Wolfe et al. | 313/336 |
| 3,869,636 | 3/1975 | Lawrence | 313/336 |
| 4,097,710 | 6/1978 | Maillet | 204/129.43 |

Primary Examiner—Saxfield Chatmon
Attorney, Agent, or Firm—Larson and Taylor

[57] ABSTRACT

A tungsten filament intended as a thermionic source, made from a wire of which the zone defining the point is of a diameter smaller than that of the basal zone and where the diameter of the transitory part of the wire changes progressively. This filament is contained in the same plane and its lower legs are welded to rigid posts in a ceramic base. A novel electrolytic sharpening process is used for the reduction of the diameter of the filament wire, and this process, which permits the progressive reduction of the dimension of a workpiece, can be used in other applications. An apparatus is used for the manufacturing of such a filament by cyclic electrolytic sharpening, as well as means enabling the bending of the wire and its positioning during the welding operation.

23 Claims, 7 Drawing Figures

THERMIONIC EMITTER FOR ELECTRON MICROSCOPY

BACKGROUND OF THE INVENTION

The present invention relates to a thermionic emitter intended, for example, for electronic microscopy, as well as the manufacture of such thermionic emitters. In electronic microscopy an electron source of very short wavelength is used, which is a function of the applied electrical voltage. This type of electron source must operate in a vacuum the degree of which varies according to the electron sources actually available. One of the types of electron guns, named a thermionic gun, emits electrons by heating the source incorporated in the gun. The emitted electrons are accelerated by an electric field which establishes the beam of primary electrons. The Wehnelt cylinder of the gun, maintained at a more negative potential than the cathode, focuses the emitted electrons toward the anode. The effective brightness of the gun is a function of the form and of the position of the filament with respect to the opening in the Wehnelt cylinder.

The performance of the electronic microscope is very dependant upon the gun brightness and upon the coherance and the stability of the electron source which, according to the theoretical model, must be a pin-point source. The point of operation of the filament is established by its temperature. If the filament temperature is increased the evaporation increases and the life span diminishes. In using conventional filaments, it is generally agreed that filament break down occurs when the reduction of filament diameter by evaporation attains about 6%.

Different gun brightness characteristics are obtained by varying the geometry of the filament point. The two conventional tungsten filament types are the standard model and the pointed model. The brightness of the pointed filament is markedly superior but results in an important decrease in life span (1 to 3 hours). Thermionic sources using lanthanum hexaboride provide more brightness than tungsten filaments but this improvement is leveled by increased cost (approximately 10 times more expensive). On the other hand, the life span is more acceptable. The other type of electron gun operates on the principle of electron emission in an electric field. It has superior brightness and coherance characteristics but it requires vacuum in the order of $10^{-9}$ to $10^{-10}$ mmHg resulting in increased cost of installation.

As a consequence, there is an urgent need for a tungsten filament operating on the principle of a thermionic emission having a greater life span than standard filaments (approximaxely 25 hours) and preferably offering a brightness equal to, or greater than that of the pointed filament of which the average life span is only a few hours. It must be realized that a short life span results not only in higher cost of filament replacement, but also in a sequence of fastidious operations, not to mention the inconveniences of interruption of observation work, the time consuming operations of gun cleaning; the assembly, the centering and the adjusting of the filament level in the gun, the alignment in the microscope column and finally the time required for reaching thermionic stabilization.

SUMMARY OF THE INVENTION

We have designed a thermionic emitting tungsten filament, of reduced point, which can provide the same yield as a pointed tungsten filament and which has a life span of the order of 300 hours. The filament is contained in the same plane. It has a smaller diameter at the point than at its lower section, hence it defines three zones: the point, the transitional zone and the base or the basal zone. The diameter varies progressively along the transitional zone.

In effect, our experimentation indicates that the causes of burn-out are, for the most part, mechanical and thermal strain in the case of standard filaments whereas evaporation is the principal cause in the case of our improved filament.

Standard filaments burn out on the average when their diameter diminishes by 6%.

The new type of reduced point filament burns out when the diameter has been reduced by 45%.

After burn-out, the two extremities have retained exactly the same position, which is never the case for standard filaments.

Testing of rapid filaments start-up, 250 cycles on-off (at less than 1 minute cycles) did not modify the mechanical or electrical characteristics of the new filament.

Thus, the limiting factors of the life span appear to be very different in the case of the filament according to this invention.

An increased mechanical stability has also been observed which proves important for maintaining the centering and the height of the filament in the gun.

This greater mechanical stability results in part from the utilization of filament legs of which the diameter is greater than at the point. Furthermore, the base of the improved filament, being colder than that of filaments of uniform cross section, results in less overall evaporation which contributes to reduce the contamination of the gun components.

The relationship between the secondary electron current as a function of the filament heating current for reduced point filaments according to this invention is different from that of the standard filament. Its curve is closer to that of pointed filaments, that is to say, there is a threshold of emission, followed by an increase, then there is a peak and then a decrease. The position and the amplitude of this peak are a function of the depth of the filament in the Wehnelt cylinder. Furthermore, the electrical characteristics of the filament according to the invention, may be changed by modifying the distribution of the point and of the transitional section. This design flexibility is desirable because it permits the manufacture and the choice of filaments for the purpose of specific applications.

A new electrolytic sharpening technique permits up to obtain the desired reduction in diameter of the filament wire: the point has a uniformly reduced diameter, whereas in the transition zone the diameter decreases progressively from the base to the point.

This method of electrolytic sharpening, which may be used for other applications, is characterized in that the point is maintained immersed in the electrolyte in fixed position while the level of the electrolyte increases and decreases cyclicly. Furthermore, by interrupting the electrolysis current in a cyclic manner to permit sharpening only during the increasing phase of the electrolytic movement a more uniform sharpening process is obtained on account of the fact that the meniscus at the filament-solution interface is compressed, and on account of the fact that the periodic sharpening interruptions permit the gas bubbles produced during electrolysis to be eliminated. This technique proves controllable and highly reproducible.

We have developed an electrolytic sharpening apparatus requiring an electro-mechanical vibrator which is used for agitating the volume of electrolyte liquid. The apparatus comprises means for controlling the amplitude and the frequency of oscillation of the electrolyte, as well as means for adjusting the reference level. Furthermore, an electronic electrolyte level detector permits verification of the above noted parameters.

A support for a filament has been devised, consisting of two centrally apertured plates one of which comprises a groove intended for containing the filament wire after bending, this support being used for centering the filament point during the welding of its legs to the ceramic support posts.

BRIEF DESCRIPTION OF THE DRAWINGS

In the accompanying drawings, wherein preferred embodiments of various aspects of this invention are illustrated.

DESCRIPTION OF A PREFERRED EMBODIMENT

Figures 1, 2, 3, 4:
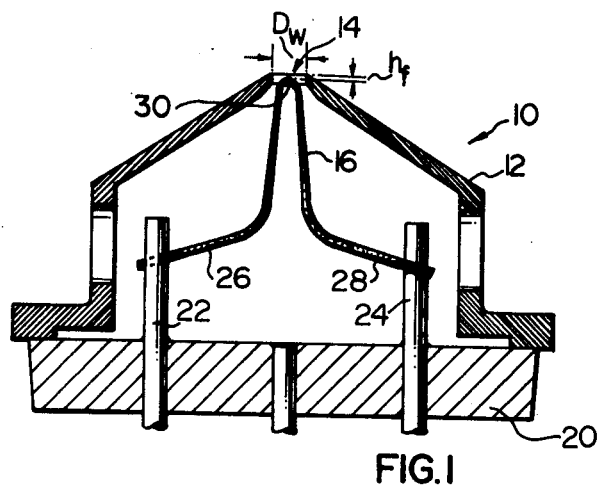
FIG. 1 is a sectional view of a thermionic emitting electron gun in which is installed a filament according to this invention.
FIG. 2 is a plan view of a ceramic support, posts and the filament retained by the posts.
FIG. 3 is an elevational view of the upper part of the tungsten wire once folded but not yet sharpened.
FIG. 4 is an elevational view of a filament showing the upper part of the basal zone, the transition zone and the filament point.

Refering now to the drawings, FIG. 1 shows in diametric cross-section a thermionic electron gun 10 comprising a Wehnelt cylinder 12 having a circular opening 14 of diameter $D_w$. A tungsten filament 16, made in accordance with this invention, is supported in an optimal position with respect to the opening 14 by means of a ceramic support 20 in which are retained two vertical posts 22 and 24. The divergent legs 26 and 28 of the tungsten filament 16 are welded according to well-known techniques to posts 22 and 24. The point 30 of the filament 16 must be located in an optimum centered position and at level $h_f$ with regard to opening 14 of the Wehnelt cylinder 12. Leveling screws (not illustrated) mounted on the periphery of the ceramic support 20 and acting against the base of the Wehnelt cylinder 12 facilitate the adjustment of the point 30 with respect to the opening 14, and the determination of the filament level is made under an optical microscope with surface lighting.

As shown in FIG. 2, the filament 16 is contained in a common plane perpendicular to the upper surface 32 of the ceramic support 20, and the point 30 is located at the center of the surface 32 by welding the legs 26 and 28 to the opposite sides of posts 22 and 24.

FIG. 3 shows the upper part of the tungsten wire 34 after folding but before the operation of sharpening the point. One begins with a tungsten wire having a diameter of 250 microns. The required length is of the order of 26 mm. In principle, one may also use other types of materials and different wire dimensions for specific applications. Such other materials could be, for example, tungsten with thorium or rhodium.

The initial form of point 30 of wire 34 is defined by the internal curvature $r_{int}$ and by the spread of the shouldering $D_1$ at a specific distance from the peak $I_d$ measuring approximately 2 mm. The bending of the lower part of wire 34 at a predetermined distance from the point 30 and at a radius $r_{inf}$ determines the position of the points of contact of legs 26 and 28 with respect to the height of posts 22 and 24 as shown in FIG. 1.

The bending is accomplished in two phases with the assistance of templates. The length of the radius of curvature of the point $r_{int}$ is critical; particular care is required during its manufacture. On the other hand, the inferior curvatures $r_{inf}$ determining the position of the electrical point of contact permits a larger tolerance.

It is to be noted that the curvature of the point and that the two lower curvatures are effected in the same plane as illustrated in FIG. 2. Thus there is no mechanical torsional strain.

Figure 5:
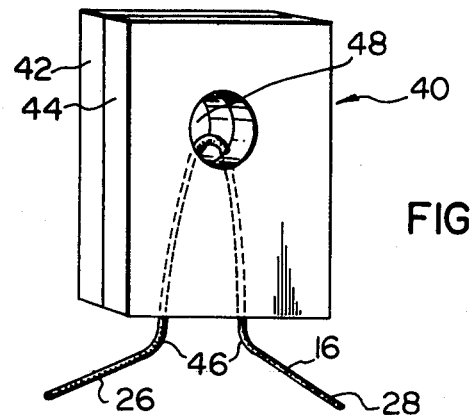
FIG. 5 is a perspective view of a filament support.

The assembly of the filament on the ceramic support 20 is greatly facilitated by the use of a rigid support 40 such as illustrated in FIG. 5. This rigid support 40 is composed of two rectangular centrally apertured members 42 and 44 retaining the filament 16 by compression. In order to insure the precise positioning of the filament 16, one of the two members 42, 44 comprises the impression of the upper part of the filament 16 to the lower curvature 46 of the legs 26 and 28. The impression is of a depth of 150 to 200 microns. The opening 48 of this support 40 extends through members 42 and 44 perpendicularly at the level of of the point of filament 16 and it permits a direct view of the point of the filament with the assistance of binaucular magnifying lenses (not illustrated).

Support 40 is mounted on an adjustable plate (not illustrated) the position of which may be varied with great precision three dimensionally, with respect to the ceramic support 20 which is supported upon a table within proximity of the welding electrodes. After welding, filament 16 is separated from its support 40 with care so as not to modify its position with respect to posts 22 and 24. The welding of the filament to the posts 22 and 24 performs two functions. First of all it insures a good electrical contact in view of the direct heating of the filament, and secondly it effects mechanical centering and levelling of point 30 of the filament. The vertical plane of the filament 16 is defined by the tip of point 30 and by the two areas of contacts on posts 22 and 24.

According to the present invention once the filament is fixed to posts 22 and 24, the next step involves sharpening the point 30 of the conducting wire 16. In FIG. 4, the diameter of wire 26 can be seen to be much greater at the base 50 than at the region of the point 52, and the change is a progressive one in the region of transition 54. The diameter 60 of the legs 26 and 28 is uniform and it is of the order of 250 microns. The diameter 62 at the point 30 is equally substantially uniform and measures approximately 120 microns in a preferred embodiment of the filament according to this invention. The transitional sections 64 and 66 have a diameter which increases progressively from region 52 to region 50.

In order to obtain this sharpening of point 30 of the filament 16 recourse is had to an electrolytic sharpening technique. As stated earlier, the initial wire has a uniform diameter which is about twice as great as that of conventional filaments. The sharpening operation aims at reducing the cross-section of the wire in the region 52 of point 30 and in the transitional region 54.

According to the present embodiment, such sharpening is obtained by changing the degree of immersion of the filament into an electrolyte in the course of electrolytic machining. In principle two options are possible for fulfilling this condition, namely: changing the position of the support with respect to the electrolytic bath, or varying the electrolyte level.

Figure 6:
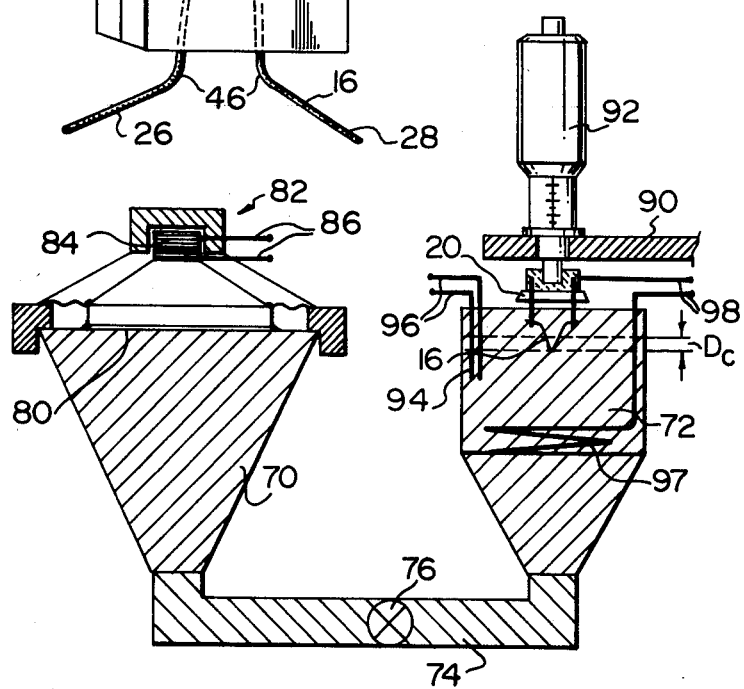
FIG. 6 is an elevational schematic view of an electrolytic sharpening apparatus.

FIG. 6 of the drawing illustrates schematically an apparatus constructed for the realization of the second alternative, which has proved to be of great flexibility.

The sharpening apparatus illustrated in FIG. 6 comprises a reservoir 70 connected to an electrolyte bath 72 by a communicating duct 74 which has a damper 76. Damper 76 comprises a valve and it is intended to insure control of the variation of electrolyte level in bath 72. The reservoir 70 is covered by an elastic membrane 80 coupled mechanically to the membrane of electro-magnetic vibrator 82. In simple and practical form, the electromagnetic vibrator 82 is made with a loudspeaker whose coil 84 is driven by a source of alternating current (a.c.) applied to terminals 86. This configuration allows the electrical control, by means of callibrated potentiometers (not illustrated), of the amplitude and of the frequency of oscillation of the electrolyte contained in reservoir 70 and in bath 72.

Filament 16 secured to the ceramic base 20 is maintained in inverted position in the electrolyte bath 72 by means of plate 90 which has a micrometric adjustment 92 for setting the initial immersion of filament 16 in the electrolyte bath 72. An electronic detector of electrolyte level 94 wired to an oscilloscope (not illustrated) by wires 96 controls the degree of sharpening.

The length of the transition region 54 is determined by the amplitude of the electrolyte oscillation in bath 72. In FIG. 6 this level variation is indicated by reference $D_c$. Electrode 97 located in the electrolyte bath 72 completes the circuit for the sharpening current via terminals 98 and the intensity of sharpening current is electronically controlled by well-known means.

Figure 7:
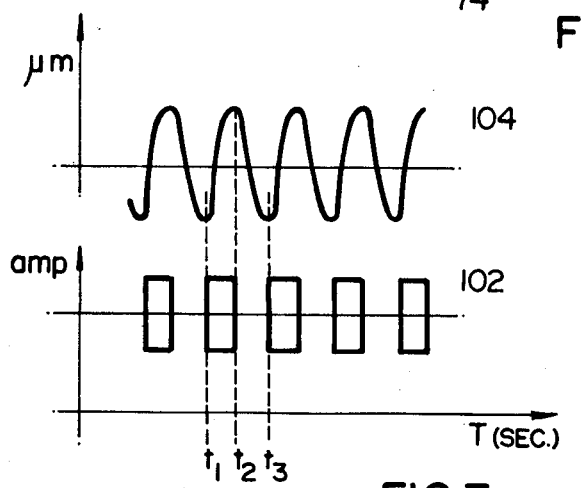
FIG. 7 is a graph showing the relationship between electrolysis current and electrolyte movement as a function of time.

In order to improve the quality of the sharpening, it is preferred to use a source of a.c. current (whose frequency may be within the range of from 20 to 500 $H_z$) which is cyclically interrupted in order to cause sharpening only during the ascending phase of the electrolyte oscillating movement. During the descending phase the source of sharpening current applied to terminals 98 is interrupted. This condition is illustrated as a function of time in FIG. 7 which comprises two graphs. Lower graph 102 represents the envelope of alternating electrolysis current of which the frequency is much greater than that of the electrolyte oscillation in bath 72. This electrolyte oscillation is represented in the upper graph 104 and it is to be noted that its form is essentially sinusoidal. At time $t_1$ the electrolyte level increases and the electrolysis current is applied until time $t_2$, at which point the electrolyte arrives at its upper level. The electrolysis current is then interrupted until time $t_3$, that is till the end of the decreasing phase of the electrolyte level. Then the electrolysis current is applied again, and so on, until complete sharpening.

According to this electrolytic sharpening technique obtained by means of cyclic sharpening a.c. current, the meniscus at the filament-solution interface is compressed, and the periodic interruption of the sharpening process facilitates elimination of the gas bubbles formed during electrolysis. This technique is easily controlled and is highly reproducible.

Prior to sharpening it is necessary to set the initial level of filament 16 with regard to the electrolyte surface in bath 72. During sharpening the electrolyte level varies in a cyclic manner, and the period and the amplitude of this oscillation are adjusted beforehand by means of a control acting upon a power source applied to terminals 86 of coil 84. The adjustments are as follows: The electrolyte is brought to its lowest level. Then, by means of micrometric support 90 and 92, the filament point 16 is lowered until mechanical contact is made with the surface of the electrolyte in bath 72. This defines immersion level zero. Lowering of the filament is continued to an initial immersion level which will determine the height of the point 52. The cyclic immersion will proceed from that level on, causing deeper immersion during sharpening, and consequently, the amplitude of the electrolyte oscillation, as indicated by reference $D_c$ in FIG. 6, determines the length of the transition zone 54 of filament 16.

For sharpening wire 16, the operator closes the circuit of electrolysis current at terminals 98, the circuit of driving potential across terminals 86 of oscillator 82. The portion of the filament initialy immersed will retain a uniform diameter but diminishing continuously during the sharpening operation. The height of the transition zone is determined by the oscillation of the electrolyte. The sharpening is a function of the frequency and of the intensity of the electrical voltage applied across terminals 86, and of the number of sharpening cycles. The sharpening in the transition zone is dependant upon the period of the electrolyte movement.

It is therefore necessary to monitor the sharpening time, the level and the amplitude of the electrolyte level change and the sharpening current. By using standardized voltage, current and frequencies, it becomes possible to control sharpening by merily counting the number of immersion cycles. A counting means with breaker can easily control this last variable. Visual control permits verification of the specified characteristics.

The parameters indicated below permit the formation of a filament point having a diameter of 120 microns and a transition height of 1250 microns. The initial filament of uniform diameter, of 250 microns is made of tungsten. The sharpening occurs in a saturated solution of $KNO_2$.

Sharpening voltage: 12 V (peak to peak)
Initial immersion of the filament: 500 microns.
Amplitude of level change $D_c$: 1250 microns.
Duration of the immersion cycle: 4.5 seconds
Number of immersion cycles: 75
Average thickness of the metal layer removed per cycle: 0.9 micron.

Before and after the sharpening operation, it is required to clean the filament, for instance: cleaning in a solution of $Na_3PO_4$ (18 g/l) under a voltage of 5 V for 15 seconds, rinsing with distilled water, rinsing with pure alcohol, oven drying at 60 degrees, all of these manipulations being made with plyers.

The manufacturing and installation time for a filament according to this invention, applying the techniques described above, is of the order of 30 minutes, and the recorded life time of filaments constructed according to this invention is of the order of 300 hours having reached, in one particular case, not less than 330.5 hours representing 55 sessions of use.

What we claim and desire to secure by Letters Patent is:

1. For use in electronic microscopes, an improved thermionic filament consisting of a one piece metallic conducting wire of circular cross-section made of tungsten or the like, bent into the general shape of an inverter V with two diverging legs in a common plane, and defining:
    (a) in a first zone, an arcuate point of essentially constant diameter acting as a thermionic cahtode;
    (b) in a secnd zone, spaced apart from said first zone, said two diverging legs which are of constant diameter;
    (c) in a third zone, intermediate said first and second zones, two transitional sections, each transitional section extending between one of said legs and one side of said arcuate point;
the diameter of said wire where it forms said arcuate point being substantially less than the diameter of said wire in said second zone and the diameter of said wire in each transitional section changing progressively from the greater diameter of said wire in said second zone to the lesser diameter of said wire in said first zone as a result of sharpening of said first and third zone by precision electrolytic shaping.

2. A thermionic filament as defined in claim 1 wherein the diameter of said wire in said first zone is about one half of the diameter of said wire in said second zone.

3. A thermionic filament as defined in claim 2 wherein the diameter of said wire in said second zone is of the order of 250 microns.

4. A thermionic filament according to claim 3 wherein the diameter of said point is about 120 microns, and wherein the angular extent of said arcuate point is of the order of 150 degrees.

5. A thermionic filament according to claim 4 wherein the internal radius of curvature of said arcuate point is about twice the diameter of said wire in said first zone.

6. A thermionic filament according the claim 5 wherein each of said transitional sections is essentially straight, curving slightly as it merges into said arcuate point.

7. A method of manufacture of a thermionic filament as defined in claim 1, on a suitable support, comprising the following successive steps:
    (a) taking a piece of tungsten or the like wire of the suitable length;
    (b) bending said wire to form in a common plane an inverted V shape with two diverging legs;
    (c) attaching said legs to said supprt, and
    (d) sharpening said filament by electrolytic sharpening, said sharpening comprising uniformly reducing the diameter of said wire at the apex of said V shape and tapering said wire apex, said uniform reduction of diameter being obtained by constant immersion in an electrolytic bath of the apex of said V shape while said tapering is obtained simultaneously by controlled cyclic immersion in the said electrolytic bath of the regions of said wire on either side of said apex under the effect of a suitable electrolysis current.

8. A method according to claim 7 in which the cyclic immersion is effected at a given amplitude corresponding to the desired length of the tapered portions of said wire.

9. A method according to claim 8 in which the electrolysis electrical current is interrupted during the descending phase of the electrolyte movement, and in which the amplitude and the frequency of the cyclic movement of the electrolyte are controlled.

10. A method according to claim 9 in which the electrolyte level is detected electronically.

11. A method according to claim 9 in which the electrolysis current is an alternating current.

12. A method according to claim 11, in which the electrolysis current frequency is from 20 to 500 Hz.

13. A method according to claim 12, in which the degree of sharpening is determined solely by controlling the numberof immersion cycles.

14. A method according to claim 7 in which the cyclic immersion is effected while the position of the conductor wire is fixed.

15. A method according to claim 14 in which the electrolysis electrical current is interrupted during the descending phase of the electrolyte movement, and in which the amplitude and frequency of the cyclic electrolyte movement are controlled.

16. A method according to claim 15 in which the degree of sharpening is determined solely by controlling the number of immersion cycles.

17. A method of precision sharpening by electrolytic immersion for the sharpening of fine elongated metallic workpiece progressively from the non-sharpened region of said metallic workpiece, comprising: mounting said workpiece above an electrolytic bath, adjusting the level of the said workpiece with respect to the upper surface of the electrolyte in a still condition, and driving said electrolyte in relative vertical oscillation, at controlled frequency and amplitude during circulation of an electrolysis electrical current thereby to cause cyclic immersion of said workpiece into said electrolytic bath.

18. A method of sharpening according to claim 17 wherein the electrolysis current is interrupted during the withdrawal phase of every immersion cycle.

19. A method according to claim 18 wherein said electrolysis current is an a.c. current of controlled intensity and frequency.

20. A method according to claim 19 wherein the degree of sharpening is determined solely by the number of immersion cycles.

21. An apparatus used for precision electrolytic sharpening of a small metallic component such as a tungsten filament comprising an electrolyte bath, an electrolyte reservoir at the same level, a lower duct in communication with the bottom of said bath and that of said reservoir, said bath, said lower duct and said reservoir being adapted to contain a determined volume of a suitable electrolyte liquid, said apparatus also comprising a support directly above said electrolyte bath and adapted to hold said component in fixed position in said electrolyte bath, coarse adjustment means for adjusting the height of said support, microscopic adjustment means for fine adjustment of the height of the support, a membrane stretched across the free electrolyte surface in said reservoir, an electro-mechanical vibrator comprising a magnetic coil adapted to vibrate said membrane and said body of electrolyte at a low frequency, means for generating a vibrator driving voltage applied across the terminals of said magnetic coil and having means for controlling the frequency and the intensity of said vibrator driving voltage, and an electrical electrolysis current circuit comprising a submerged electrode in said bath below said component and a second electrode formed by said component.

22. An apparatus according to claim 21 comprising a damper in said lower duct, and a counter used to determine the number of oscillation generated by said vibrator.

23. An apparatus according to claim 21 or to claim 22, wherein said vibrator is a low frequency loudspeaker.

* * * * *